(12) United States Patent
Thiesen et al.

(10) Patent No.: US 7,047,800 B2
(45) Date of Patent: May 23, 2006

(54) PIEZOELECTRIC CERAMIC FIBERS HAVING METALLIC CORES

(75) Inventors: Jack Thiesen, Easley, SC (US); John David Adamson, Simpsonville, SC (US)

(73) Assignee: Michelin Recherche et Technique S.A. (CH)

( * ) Notice: Subject to any disclaimer, the term of this patent is extended or adjusted under 35 U.S.C. 154(b) by 0 days.

(21) Appl. No.: 10/865,305

(22) Filed: Jun. 10, 2004

(65) Prior Publication Data

US 2005/0274176 A1  Dec. 15, 2005

(51) Int. Cl.
G01M 17/02  (2006.01)
(52) U.S. Cl. ............................................. 73/146; 290/1
(58) Field of Classification Search .................. 73/146; 307/44, 46; 290/1
See application file for complete search history.

(56) References Cited

U.S. PATENT DOCUMENTS

| 2,742,941 A | | 4/1956 | Johnson | |
| 4,160,234 A | * | 7/1979 | Karbo et al. | 340/443 |
| 5,473,938 A | * | 12/1995 | Handfield et al. | 73/146.5 |

(Continued)

FOREIGN PATENT DOCUMENTS

EP  1486356 A  12/2004

EP  1356958 A  1/2005

(Continued)

*Primary Examiner*—Edward Lefkowitz
*Assistant Examiner*—Andre Allen
(74) *Attorney, Agent, or Firm*—Dority & Manning, P.A.

(57) ABSTRACT

An enhanced piezoelectric wire structure includes an elongated portion of piezoelectric material, a metallic core, and an outer conductive sheath. The metallic core is substantially surrounded by the elongated portion of piezoelectric material and configured to function as a first electrode for the piezoelectric structure. The conductive outer sheath preferably covers selected areas of the elongated portion of piezoelectric material and functions as a second electrode for the structure. The piezoelectric material may correspond to barium titanate ceramic fibers, such that a lead-free structure is effected, however other piezoelectric materials may also be utilized. The disclosed structure can be poled with a reduced poling voltage and lower temperature level, and also requires a reduced voltage potential level required for mechanical actuation. A collection of such piezoelectric structures can be provided together in a modular patch assembly that may be formed in a variety of customized configurations for integration with various environments, and can function as a mechanical actuator device, a condition-responsive device (e.g., a sensor) and/or as a power generation device. When utilized as a power generation device, the subject piezoelectric assembly can power tire electronics components such as a revolution counter, a sensor, a rechargeable battery, a flashing light assembly, a microcontroller, a global positioning system (GPS), and a radio frequency (RF) device.

36 Claims, 4 Drawing Sheets

U.S. PATENT DOCUMENTS

| | | | |
|---|---|---|---|
| 5,570,286 A * | 10/1996 | Margolis et al. | 701/36 |
| 5,634,993 A | 6/1997 | Drieux et al. | |
| 5,891,279 A | 4/1999 | Lacour | |
| 6,415,839 B1 | 7/2002 | Pompier et al. | |
| 6,725,713 B1 * | 4/2004 | Adamson et al. | 73/146.5 |
| 6,807,853 B1 * | 10/2004 | Adamson et al. | 73/146 |
| 6,847,126 B1 * | 1/2005 | Adamson et al. | 290/1 R |
| 2002/0124923 A1 | 9/2002 | Abinal et al. | |
| 2002/0124924 A1 | 9/2002 | Abinal et al. | |
| 2003/0005991 A1 | 1/2003 | Drap | |
| 2003/0209063 A1 * | 11/2003 | Adamson et al. | 73/146 |
| 2003/0209301 A1 | 11/2003 | Pompier et al. | |
| 2004/0164558 A1 * | 8/2004 | Adamson et al. | 290/1 R |
| 2005/0116545 A1 * | 6/2005 | Hamel et al. | 307/46 |
| 2005/0140212 A1 * | 6/2005 | Hamel et al. | 307/44 |
| 2005/0146220 A1 * | 7/2005 | Hamel et al. | 307/44 |

FOREIGN PATENT DOCUMENTS

| | | |
|---|---|---|
| EP | 1522427 A | 4/2005 |
| EP | 1559589 A | 8/2005 |
| WO | WO01008905 A | 2/2001 |
| WO | WO0132450 A1 | 5/2001 |
| WO | WO05068227 A | 7/2005 |

\* cited by examiner

PIEZOELECTRIC CERAMIC FIBERS HAVING METALLIC CORES

FIELD OF THE INVENTION

The present invention generally concerns improved piezoelectric materials for use in tire and wheel assembly applications, and more particularly for utilization in sensor or actuator devices or in power generation modules for tire electronics assemblies or other vibrational systems.

BACKGROUND OF THE INVENTION

The incorporation of electronic devices with pneumatic tire structures yields many practical advantages. Tire electronics may include sensors and other components for obtaining information regarding various physical parameters of a tire, such as temperature, pressure, number of tire revolutions, vehicle speed, etc. Such performance information may become useful in tire monitoring and warning systems, and may even potentially be employed with feedback systems to regulate proper tire pressure levels and with vehicle performance and control systems.

Yet another potential capability offered by electronics systems integrated with tire structures corresponds to asset tracking and performance characterization for commercial vehicular applications. Commercial truck fleets, aviation crafts and earthmover/mining vehicles are all viable industries that could utilize the benefits of tire electronic systems and related information transmission. Tire sensors can determine the distance each tire in a vehicle has traveled and thus aid in maintenance planning for such commercial systems. Vehicle location and performance can be optimized for more expensive applications such as those concerning earth mining equipment. Entire fleets of vehicles could be tracked using RF tag transmission.

Certain piezoelectric materials have been utilized in various applications related to tire and wheel assemblies and other vibrational systems. For example, piezoelectric transducers can be used as sensors to measure the response to an impressed acoustic field. Piezoelectric actuators can convert an applied electric field into kinematic energy and mechanical displacement. Piezoelectric reeds and other specialized piezoelectric formations have been employed to convert mechanical vibrations from tire rotation to electrical energy for powering tire electronics assemblies.

Utilization of piezoelectric materials in the above applications and others is often limited due to the unique nature and the potential limitations inherently associated with the structure and performance abilities of piezoelectric materials. Piezoelectric crystals and fibers are often subject to cracking and/or breaking under high strain levels. Piezoelectric ceramics require at least one poling treatment to align the polar domains of a material thus rendering it able to function as a sensor or actuator device. The integration of electrodes with a piezoelectric material must typically be precisely configured and maintained for effective operation of a piezoelectric device. Furthermore, certain types of piezoelectric materials may not be well suited for a given application or in a given environment. For example, although lead zirconate titanate (PZT) material are often characterized by sexiirable performance characteristics, lead-based materials may not be preferred for certain applications.

In accordance with the present subject matter, it is appreciated that certain advantages of piezoelectric materials have long been recognized. However, such technology is constantly improving, thus potentially affording applications that utilize piezoelectric materials and piezoelectric structures with improved operating capabilities. The present invention addresses the presently disclosed concerns and others as related to the use of piezoelectric materials for various tire and wheel assembly applications and offers improved piezoelectric structures for such applications and others.

SUMMARY OF THE INVENTION

In view of the recognized features addressed by the present subject matter, improved piezoelectric ceramics for applications associated with tire and wheel assemblies have been developed. The improved piezoelectric structures include piezoelectric ceramic fibers formed with a metallic core and provided with an outer conductive sheath. The metallic core and conductive sheath serve as first and second electrodes to the piezoelectric material, and may be interfaced with additional electronics for utilization in sensor or actuator devices or in power generation modules for tire electronics assemblies.

Various features and aspects of the subject piezoelectric technology and tire electronics applications offer a plurality of advantages. The disclosed piezoelectric structures are provided with significant design versatility due to their unique electrode configurations. The flexible nature of the piezoelectric ceramics in their green state enables the formation of the subject piezoelectric structures with a variety of cross-sectional shapes. In addition, the structures can be oriented in a multitude of different configurations, such as in a substantially straight line, in a two-dimensional sinusoidal configuration or in a three-dimensional helical configuration.

Another advantage of the present technology is that the disclosed piezoelectric technology can be utilized for various applications as single structures or as a modular collection. Combining multiple piezoelectric structures in a modular patch-like assembly is facilitated by the provision of outer sheath electrodes. The modular assemblies may be provided in multiple layers and customized for operation in particular environments and for mounting to particular surfaces.

A still further advantage of the present subject matter is that the disclosed piezoelectric structures can be poled with a lower poling voltage magnitude as well as at a lower temperature level, thus facilitating any necessary repoling of the piezoelectric device. A corresponding reduction in the magnitude of the voltage potential level required for mechanical actuation of the device makes the disclosed structures ideal for use in certain piezoelectric actuator applications.

Not only can the subject structures operate as an actuator device, but as a condition-responsive device, such as a transducer or sensor, or as a power generation device. A power generation device provided in a tire assembly can power numerous tire electronics systems, including a revolution counter, peripheral sensors, a rechargeable battery, a flashing light assembly, a microcontroller, a global positioning system (GPS), and a radio frequency (RF) transponder or other RF device. When the disclosed technology is employed as a power generation device, the structures provide for a self-powered tire electronics system that is not dependent on replacement of batteries. Although batteries and battery-operated devices may still be incorporated with aspects of the present subject matter, many complications regarding tire electronics that are solely powered by batteries or other power solutions are obviated in accordance with the disclosed technology.

Additional advantages of the present subject matter include the design versatility with regard to types of material for use in the present structures. One particular type of piezoelectric material that is generally well-suited for use in the ceramic fibers of the subject structures is barium titanate, which may be preferred in many applications since it does not include any lead.

A still further advantage of the present subject matter is that the disclosed system and method for generating power and utilizing such power can be used in accordance with a variety of existing applications. Measurement capabilities, monitoring and warning systems, vehicle feedback systems, and asset tracking potential may be possible for applications such as commercial truck fleets, airplanes, and mining/earthmover equipment.

In one exemplary embodiment of the present subject matter, an electronics assembly includes at least one piezoelectric wire structure and a microcontroller. The piezoelectric wire structure includes an elongated portion of piezoelectric material, a metallic core, and a conductive outer sheath. The metallic core is substantially surrounded by the elongated portion of piezoelectric material and configured to function as a first electrode for the piezoelectric structure. The conductive outer sheath preferably covers selected areas of the elongated portion of piezoelectric material and functions as a second electrode for the piezoelectric structure. The microcontroller is coupled to the at least one piezoelectric wire structure for monitoring amounts of electric charge generated by the piezoelectric structure (such as in accordance with the piezoelectric wire structure being configured for operation as a condition-responsive device) or for monitoring the amount of electric charge provided to the piezoelectric wire structure (such as in accordance with the piezoelectric wire structure being configured for operation as a mechanical actuator). When the piezoelectric wire structure is configured to operate as a condition-responsive device, the structure may monitor predetermined characteristics such as temperature and/or pressure, and/or levels of relative static and/or dynamic forces. When utilized in such an environment as a tire or wheel assembly, the piezoelectric wire structure may also be employed to determine such information as the number of tire/wheel revolutions and/or vehicle speed. An RF device may be further coupled to the piezoelectric wire structure (such as via the microcontroller) to communicate signals output by or for input to the piezoelectric structure.

Another exemplary embodiment of the present technology corresponds to a power generation device including a modular patch of multiple piezoelectric structures as described above as well as an energy storage device. In accordance with such a modular assembly, a collective plurality of inner cores is configured to function as a first electrode while a conductive material encompassing all the structures forms a common second electrode. The modular patch is configured to generate an electric charge therein when the power generation device is subjected to mechanical vibrations. One example of an environment in which such mechanical vibrations could be experienced is in a tire or wheel assembly. The energy storage device (e.g., a capacitor or rechargeable battery) is configured to store selected amounts of the electric charge generated by the modular patch. The stored energy may then be utilized to power such electronic components as, for example, a revolution counter, a peripheral sensor, a flashing light assembly, a microcontroller, an RF device, a GPS device, etc.

In accordance with the aforementioned electronics assemblies, the amount of electric charge generated by the at least one piezoelectric wire structure or the modular patch of such structures may be monitored to determine when the effectiveness of the structures falls below a predetermined threshold value, such as may be indicative of the need to repole the piezoelectric structures. In the event that a need for such repoling is determined, the electrodes of the piezoelectric structures may be coupled to a power source capable of supplying enough charge to effect device repoling.

A still further exemplary embodiment of the present subject matter concerns a tire assembly with integrated power generation features, the tire assembly including a pneumatic tire structure and a modular patch of piezoelectric material as described above. The pneumatic tire structure is characterized by a crown having a tread portion for making contact with a ground surface, bead portions for seating the tire to a wheel rim, and sidewall portions extending between each bead portion and the crown. The modular patch is integrated with a selected portion of the pneumatic tire structure and configured to generate an electric charge therein when the pneumatic tire structure is subjected to mechanical strains. In some embodiments, an energy storage device is configured to receive the electric charge generated in the modular patch of piezoelectric material and to store selected amounts of the energy therein. In order to facilitate integration of the power generation device with the tire structure, the modular patch may be attached to or embedded in a piezoelectric wire structure.

Yet another exemplary embodiment of the present subject matter concerns a method of generating power from piezoelectric materials integrated with a vibrational system. Such a method includes the steps of providing at least one piezoelectric wire structure at a selected location relative to the vibrational system, subjecting the at least one piezoelectric wire structure to mechanical strains associated with the vibrational system, and storing selected amounts of electric charge that is generated in the at least one piezoelectric wire structure when it is subjected to the mechanical strains. The at least one piezoelectric wire structure may be characterized by an elongated portion of piezoelectric material configured with an inner and outer electrode. The power generated in such structure may be used to power electronic device associated with the vibrational system.

Additional objects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
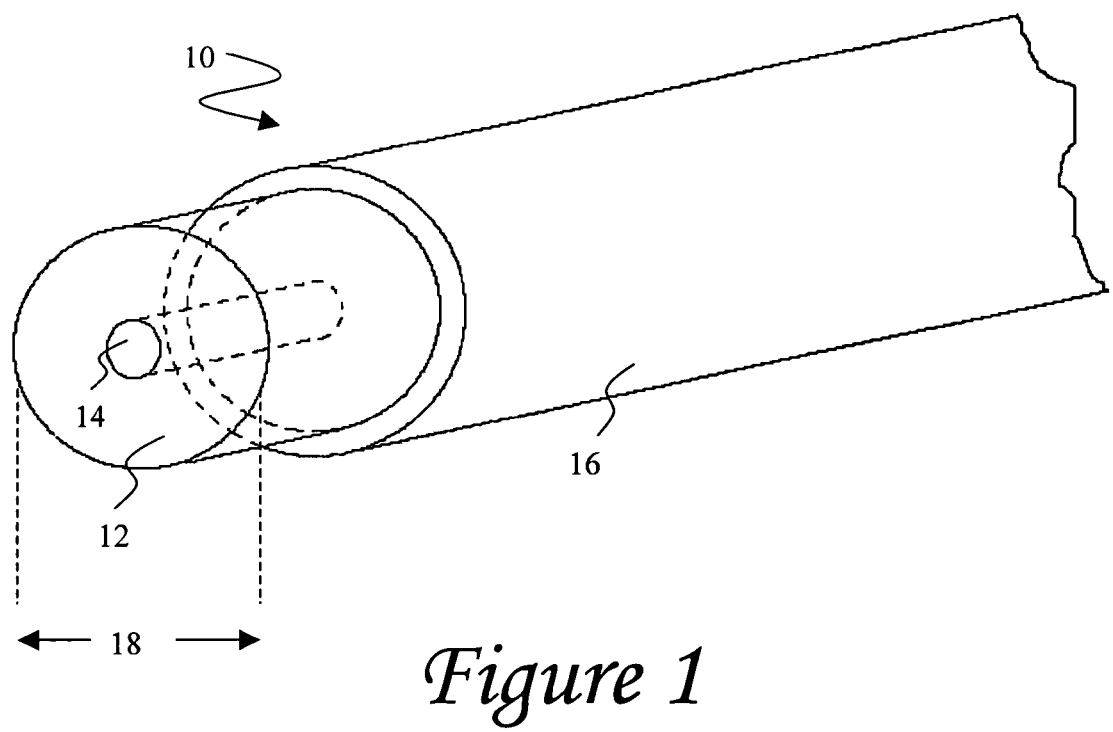
FIG. 1 displays a generally cross-sectional perspective view of an exemplary piezoelectric wire structure for use in embodiments of the present subject matter.

Repeat use of reference characters throughout the present specification and appended drawings is intended to represent same or analogous features or elements of the invention.

DETAILED DESCRIPTION OF THE PREFERRED EMBODIMENTS

Figure 5:
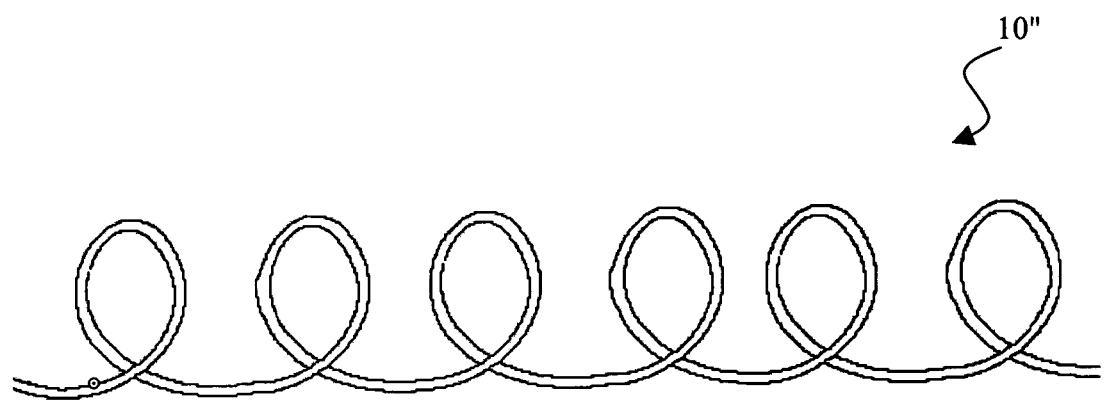
FIG. 5 displays an exemplary piezoelectric wire structure in accordance with the present subject matter configured in a generally three-dimensional helical orientation.
Figure 6:
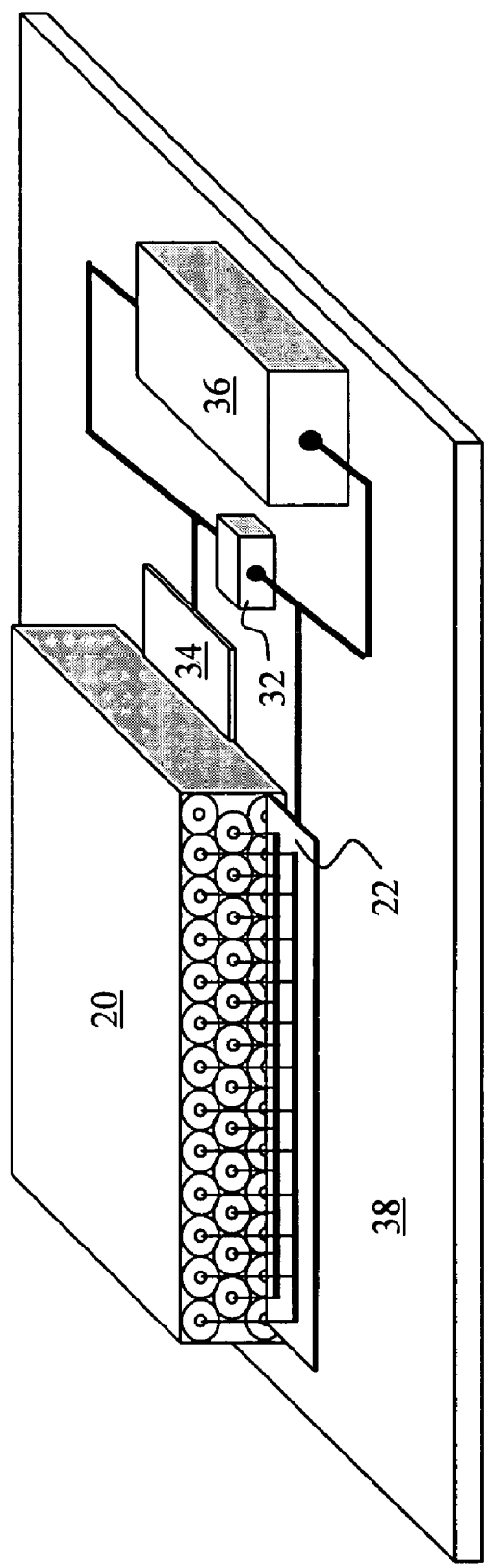
FIG. 6 is an isometric view with slight top perspective of a modular piezoelectric patch in accordance with the present invention provided with additional support features and peripheral electronic components.

As discussed in the Summary of the Invention section, the present subject matter is particularly concerned with improved piezoelectric materials for use in tire and wheel assembly applications, and more particularly for utilization in sensor or actuator devices or in power generation modules for tire electronics assemblies. The improved piezoelectric materials consist of piezoelectric ceramic fibers, such as barium titanate, formed with a metallic core, aspects of which are depicted in FIGS. 1, 2, 4, and 5. The integration of such piezoelectric structures with a tire assembly is illustrated in FIGS. 3A and 3B. When the subject piezoelectric modules are employed in power generation applications, the modules may be used to power electronics systems, as depicted in FIG. 6.

Selected combinations of the aforementioned aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function. Similarly, certain process steps may be interchanged or employed in combination with other steps to yield additional exemplary embodiments of the present subject matter.

Reference will now be made in detail to the presently preferred embodiments of the subject piezoelectric structures in conjunction with electronics systems integrated within a tire or wheel assembly. Referring now to the drawings, FIG. 1 provides a generally cross-sectional perspective view of an exemplary piezoelectric wire structure 10. Piezoelectric wire structure 10 is formed from a portion of piezoelectric material 12 having a metallic core 14. Both such portions may be formed in an elongated wire-like configuration by co-extrusion, or the piezoelectric material may be formed on the metallic core by dipping, spraying, plasma deposition, or other fabrication methods as will be appreciated in the art. The wire-like structure 10 may have a generally circular cross section with an exemplary diameter 18 of between about fifty (50) and five hundred (500) microns in some embodiments. It should be appreciated that such exemplary dimensions should in no way be limiting to the present invention and that smaller or larger cross-sectional dimensions are readily appreciated for specific applications. It should be further appreciated that although the structure represented in FIG. 1 is illustrated as having a generally circular cross section, other structures, such as one having a generally square cross section or other formations, are contemplated and thus within the spirit and scope of the presently disclosed technology. The design versatility of structure 10 is facilitated by the flexible nature of the ceramic material in its green state before firing of the device.

The piezoelectric material 12 of structure 10 is preferably a piezoelectric ceramic in fiber form, such as barium titanate or lead zironate titanate (PZT) fibers, but may also correspond in some embodiments to materials such as quartz, cadmium sulfide, polyvinylidene fluoride (PVDF) or polyvinyl chloride (PVC), or other piezoelectric materials in either fiber or crystal form as may be recognized by one of skill in the art. It should be appreciated that certain of such exemplary materials may be better suited for use within a tire structure, and material selection may thus depend on certain performance characteristics. For example, PZT ceramics are known to have relatively high performance yields in many environments, and may thus be beneficial for certain applications. However, since barium titanate is a similar piezoelectric ceramic that is lead-free, it may be better suited for other applications. It should be noted that technological advances regarding these and other piezoelectric materials may make a given piezoelectric material more suitable for use with vehicular applications, and thus it is within the scope of the present invention to include such newly developed materials in the subject structures.

Referring still to FIG. 1, the metallic core 14 of piezoelectric wire structure 10 forms a first electrode for the piezoelectric device, while an outer conductive sheath 16 provided around the piezoelectric material serves as a second electrode for the device. The outer sheath 16 also offers protection for the piezoelectric material 12, which is advantageous since cracks or breaks in the piezoelectric material will inherently reduce its performance capabilities. Exemplary materials for such conductive portions 14 and 16 include silver palladium, nickel, copper, alumna fibers, or other metallic substances or metallic alloys as understood by one of skill in the art. The poling direction for this resultant structure 10 is between the inner conductive core 14 and the outer conductive sheath 16.

Once the structure 10 is formed, the device must be poled in order to align the domains, or regions of locally aligned adjoining dipoles, of the piezoelectric ceramic fibers. A poling treatment typically involves exposing the piezoelectric ceramic 12 to a strong, direct current electric field, such as via voltage application to the first and second electrodes formed by conductive portions 14 and 16. This is typically done at a temperature slightly below the Curie point, which is the maximum temperature to which a poled piezoelectric material can be exposed while still able to properly function.

After piezoelectric structure 10 has been subjected to a poling treatment, most of the dipoles of the piezoelectric material are aligned in the poling direction, thus enabling the structure to effectively exhibit piezoelectric properties. When structure 10 is subjected to strains such as mechanical tension or compression, a voltage is created across the two electrodes 14 and 16, thus converting mechanical energy to electrical energy. In accordance with this piezoelectric action, structure 10 can be utilized as a sensor or as a power generation device, as later discussed in further detail. Conversely, if a voltage of the same polarity as the poling voltage is applied to the piezoelectric material 12 (across the electrodes 14 and 16,) the diameter 18 of structure 10 will increase, thus converting electrical energy into mechanical energy. If a voltage of the opposite polarity as the poling voltage is applied to the structure 10, the diameter 18 will decrease. This type of piezoelectric action enables the structure 10 to be utilized as an actuator device, as later discussed in further detail.

Nearly all piezoelectric structures must be poled before they will effectively function in the manner(s) mentioned above. The novel arrangement illustrated in FIG. 1 yields a structure that can be poled with a lower poling voltage magnitude as well as at a lower temperature level, thus greatly simplifying the fabrication of structure 10 and any modular collection of multiple such wire-like elements. This also reduces the magnitude of the voltage potential level required for mechanical actuation of the device.

It should be further noted that even after a piezoelectric structure has been subjected to an initial poling treatment, excessive exposure to mechanical and/or electrical stress may cause degeneration of the piezoelectric material, causing misalignment of the piezoelectric dipoles and reduced performance abilities of the piezoelectric structure 10. As such, it may become necessary to repole the device, which presents an additional advantage of the reduced potential level required to pole and repole the device. Many embodiments of the present technology employ the subject piezoelectric structure in tire or wheel applications. If regeneration is needed after the piezoelectric structure has already been initially poled and integrated with a tire structure, relatively lower poling voltage requirements may make it easier to provide a means within the tire for repoling the piezoelectric structure. Such a repoling means may be effected by electric charge stored in accordance with piezoelectric power generation or by the provision of an alternative power source such as a battery. More particular aspects of such repoling features will be presented later with reference to FIG. 6.

Figure 2:
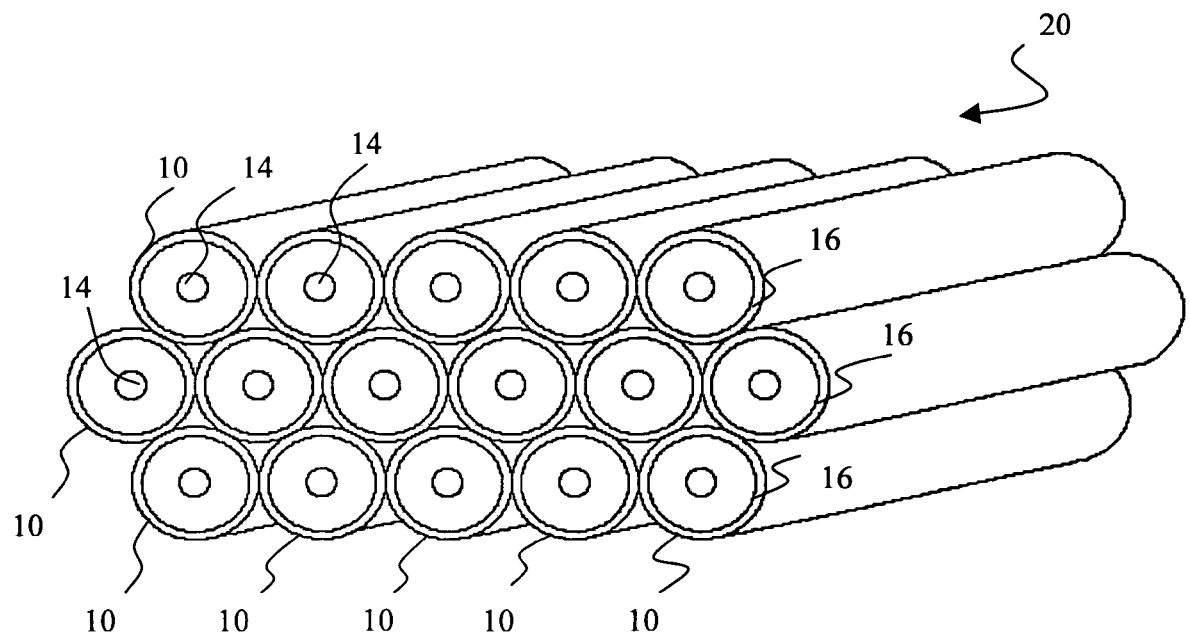
FIG. 2 displays a perspective view of a functional collection of piezoelectric wire structures for use in some embodiments of the present subject matter, for utilization as a modular piezoelectric patch.
Figure 3B:
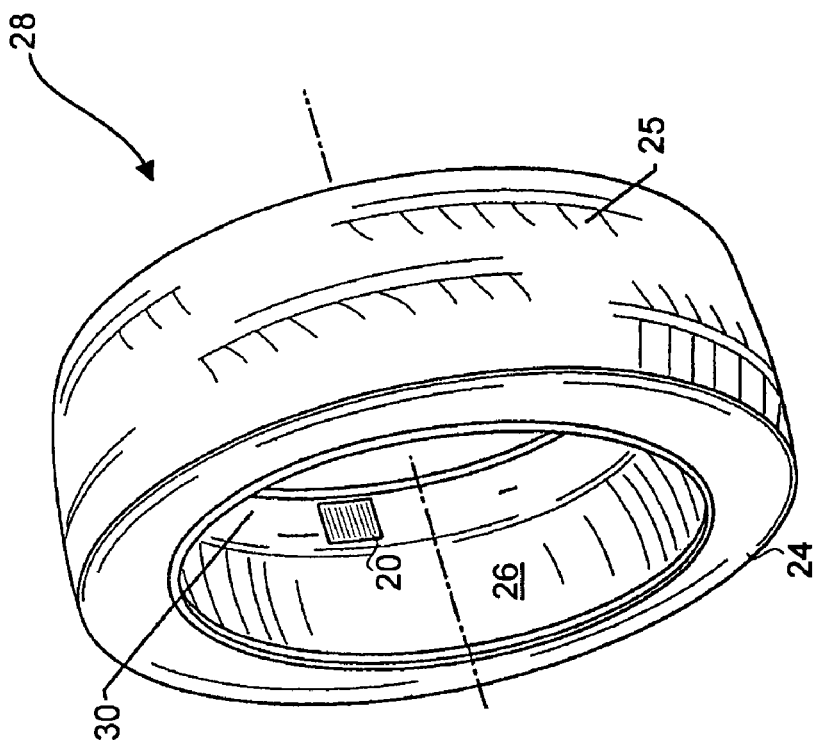
FIGS. 3A and 3B respectively display isometric views of exemplary tire assemblies in accordance with the present subject matter, illustrating respective exemplary configurations for orienting a piezoelectric patch with a pneumatic tire structure.
Figure 3A:
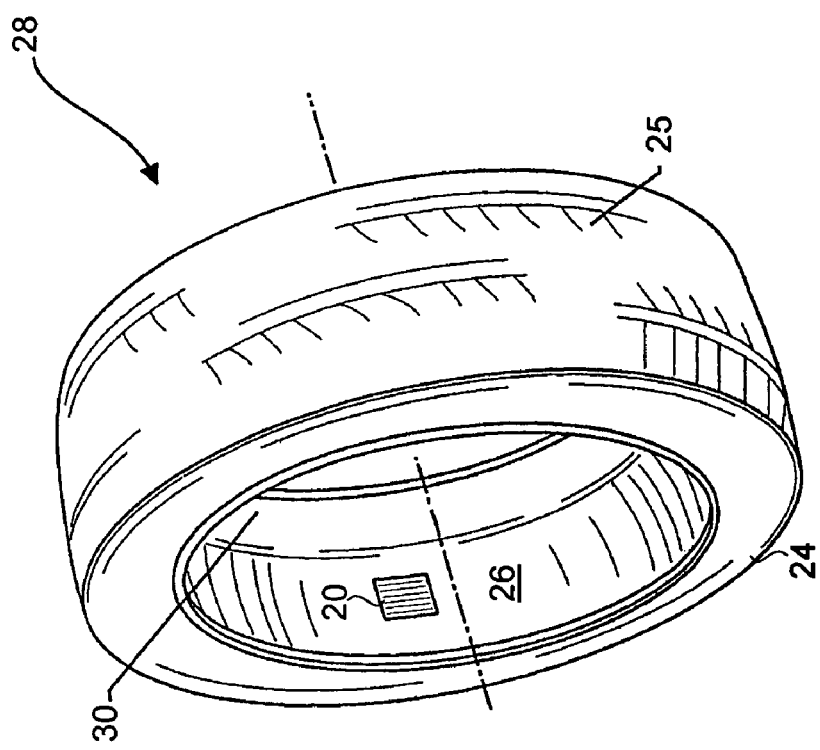
Figure 4:
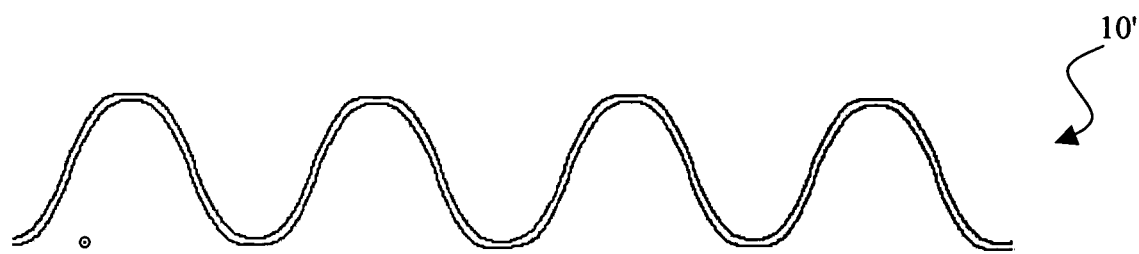
FIG. 4 displays an exemplary piezoelectric wire structure in accordance with the present subject matter configured in a generally two-dimensional sinusoidal orientation.

In accordance with the present technology, a plurality of piezoelectric structures 10 may be combined together to form a modular patch of piezoelectric structures, depicted as assembly 20 in FIG. 2. Assembly 20 combines multiple structures 10, with the respective outer electrodes 16 provided in contact with one another so that a common electrode termination is formed for the assembly 20. It may be possible in other embodiments to form a common electrode termination by embedding multiple co-extruded wires formed by respective cores 14 and piezoelectric portions 12 in a unified portion of metallization, conductive epoxy, or the like. Individual electrical connections to the respective inner cores 14 serve as the other assembly termination. The formation of such termination may be effected by any number of known methods as appreciated by one of skill in the art, and thus is not discussed in detail herein. An example of a connection type for terminating the respective inner cores is a customized ribbon connector or multiple pincer-like connections, as depicted by the termination 22 of FIG. 6.

The configuration of piezoelectric structure 10 becomes particularly advantageous when combining multiple structures 10 in an assembly 20 as in FIG. 2, due to the unique electrode formations. It is possible for multiple layers (e.g., three layers are illustrated in FIG. 2) to form the active region of the piezoelectric assembly. In other known piezoelectric patch embodiments, multiple piezoelectric fibers (lacking inner core electrodes) are provided side by side in a single planar layer. First and second electrodes may then be formed, for example, by screen-printing interdigitated electrode fingers along top and/or bottom surfaces of the planar fiber assembly. Such configurations are limiting in the sense that electrodes can interface with only a single layer of piezoelectric fibers. Furthermore, the interface between the electrodes and the piezoelectric material must be precisely configured and maintained for effective operation of such an assembly.

The ability to provide multiple layers and unique modular formations of piezoelectric wire structures in accordance with the present subject matter offers not only design versatility, but an ability to customize the formation of a modular patch to suit a particular application. For instance, if mechanical strains to which a piezoelectric assembly 20 is typically subjected to are relatively localized along one axis, the thickness (or number of layers) of the active region can be increased to reduce capacitive losses in the assembly 20 as it is subjected to the typical mechanical strains. Furthermore, multiple piezoelectric structures can be combined in a module that is designed to conform to a particular mounting surface, including any macroscopic variations thereof. Referring to FIGS. 3A and 3B, a modular patch of piezoelectric material 20 may be formed in accordance with the interior surface of a tire structure 24. By designing a modular patch assembly to match the unique contours of a tire structure, the piezoelectric fibers may be in an unstressed state when affixed to or embedded within a tire. This allows for better utilization of vibrational or scavenged energy within the patch 20 when it is utilized as a sensor or power generation device.

When combining multiple piezoelectric structures 10 in a modular assembly 20 (such as in FIG. 2), additional design consideration may often be applied to the selected orientation of the wirelike structures 10 relative to a tire structure 24 (such as represented in FIGS. 3A and 3B.) When orienting the piezoelectric fiber structures along the circumferential direction of a tire, piezoelectric fibers are subjected to generally high tensile strains, but low compressive strains. In accordance with circumferential fiber orientation, it may be preferred to integrate modular assembly 20 in the crown portion 26 of a tire structure 24, such as illustrated in the exemplary tire assembly embodiment 28 of FIG. 3A. Orienting the fiber direction along the radial direction of a tire couples the primary energy harvesting to the radial strains. This orientation is less likely to cause damage to fibers, but yields a potentially higher susceptibility of compressive depoling of the fibers. In accordance with radial fiber orientation, it may be preferred to integrate the modular assembly 20 in a selected sidewall portion 30 of a tire structure 24, as shown in the exemplary tire assembly embodiment 28 of FIG. 3B. Thus, orienting a modular piezoelectric patch of the present subject matter radially versus circumferentially along a tire structure may be determined based on the size of the patch and the specific tire environment to which it will be subjected. More particularly, optimal placement and orientation of a piezoelectric patch may be based on factors such as maximum power desired per tire cycle, peak tensile and compressive strains along radial versus circumferential mounting directions, and strain uniformity over a piezoelectric patch at given times.

A single piezoelectric structure 10 or modular patch 20, as illustrated in the exemplary tire assembly embodiments 28 of FIGS. 3A and 3B, may be mounted to the interior crown surface 26 or an interior sidewall surface 30 of tire structure 24. These locations are generally well-suited for actuation of the piezoelectric material within patch 20 as the tread portion 25 of tire structure 24 moves along a ground surface and results in flexure of the tire structure. This tire flexure coupled with the general mechanical vibrations as the tire assembly 28 moves along a surface enable the piezoelectric structures to generate electric charge, enabling operation of the modular patch as a sensor or power generation device. Further, patch 20 could be mounted and cured within tire structure 24, for example, between carcass and inner liner portions of a conventional tire structure. Patch 20 may alternatively be provided in an additional rubber or elastomer casing before being adhered to or embedded in the tire to provide additional protection. Such casing additionally provides for facilitated adhesion of the piezoelectric patch to a tire structure. The rubber casing may alternatively be provided adjacent to a single side of patch 20 for support, which may then be adhered to an inner surface of a tire structure. In accordance with the variety of possible locations for a piezoelectric structure, it should be understood that the term "integrated" generally encompasses all possible locations, including being mounted on or in a tire structure.

As previously noted, a piezoelectric structure 10 or modular patch assembly 20 may be utilized in a variety of different fashions, as contemplated for use in tire and wheel assemblies as well as other environments. For example, a piezoelectric patch in accordance with the present subject matter can be employed as an actuator, a sensor, a power generation module, or as a combination of any or all of these devices. Since the subject piezoelectric structures are freed from the constraint of being simple beams or planar assemblies, an unlimited variety of piezoelectric actuator and sensor embodiments are possible. Some exemplary embodiments include a two-dimensional sinusoidal configuration 10' as illustrated in 4 or a three-dimensional helical, or spring-like, configuration 10'' as illustrated in FIG. 5. It should be appreciated that other variations to the orientation of piezoelectric structures (generally 10) are within the spirit and scope of the present invention. Such embodiments could provide enhanced ranges of strain under which the piezoelectric structures could effectively operate, and may also yield very sensitive vibrational sensors with many decades of dynamic range.

Utilization of the subject piezoelectric structures as a mechanical actuator device are desirable since piezoelectric actuators are typically characterized by relatively quick response times and high efficiency of energy conversion. Piezoelectric actuators are typically easily adapted to device miniaturization, thus making implementation of a piezoelectric actuator feasible with a single piezoelectric structure or with a modular patch assembly. Additional advantages may be realized since a relatively low voltage potential is required for actuation of the piezoelectric device.

The subject piezoelectric structures or modular patches thereof may be utilized as a condition-responsive device, such as a transducer, sensor, acoustic device, or other component that provides some sort of output in response to change in input conditions. Such a condition-responsive device can be used to monitor any number of tire or wheel characteristics such as, but not limited to temperature, pressure, number of tire revolutions, vehicle speed, and level of three-dimensional static and dynamic forces (such as sidewall deflection or tire displacement) acting on or associated with a tire structure. A combination of piezoelectric transducers may be utilized in a single acoustic device that is capable of monitoring both the temperature and pressure associated with a given tire structure by measuring response in a piezoelectric structure to impressed acoustic fields and other forces.

A still further significant application of the subject piezoelectric structures corresponds to the creation of a power generation device for use in a tire structure. Conventional power sources used to power tire electronics assemblies may correspond to batteries or power scavenged from a proximal radiating antenna. Batteries may need to be periodically replaced if they are not rechargeable, and often pose disposal and efficiency concerns. Embodiments that scavenge RF power from an interrogation antenna are often quite inefficient, expensive and susceptible to damage. Thus, a piezoelectric patch in accordance with the subject technology may provide an improved power source for tire electronics assemblies by harvesting the electric charge generated within a piezoelectric patch when the tire is subjected to mechanical strains. Sufficient amounts of mechanical strain can occur during conventional tire rotation.

The capabilities of the subject power generation device with piezoelectric materials, as hereafter presented, offer numerous advantages over conventional techniques for providing power within a tire assembly. Antenna beam power scavenging techniques, as discussed above, are no longer one of limited options to choose from for powering tire electronics. As such, the functional capabilities of many types of tire electronics are generally increased. The option of utilizing batteries for power generation is no longer essential, thus avoiding costly and cumbersome battery replacement. Although the presently disclosed technology provides for a power generation device that enables antenna beam power and batteries to be eliminated, it should be appreciated that a power generation device could employ a hybrid combination of piezoelectric technology and/or batteries and/or antenna beam scavenging to power different selected electronic components within a wheel assembly.

When a piezoelectric patch 20 is utilized as a power generation device, it is typically provided in conjunction with some sort of energy storage and/or conditioning device 32, such as represented in FIG. 6. Energy storage device 32 may be coupled in parallel with first and second electrical terminations 22 and 34 such that it receives selected amounts of the electric charge generated in patch 20 when it is subjected to mechanical strains. Energy storage device 32 may correspond to an electrolytic capacitor, such as a Panasonic TEL series tantalum capacitor with a capacitance of at least about forty-seven µF. Other types of capacitors, such as super capacitors or non-electrolytic capacitors may similarly be suitable for utilization as energy storage device 32. Energy storage device 32 may also correspond to a rechargeable battery such as a LiteStar brand solid-state rechargeable battery such as offered for sale by Infinite Power Solutions. Other rechargeable solid-state batteries or rechargeable chemical batteries may also be employed as energy storage device 28.

Supplemental power harvesting circuitry may be provided in conjunction with energy storage device 34 to yield a conditioned power source for certain tire electronics components. An example of such power harvesting/conditioning circuitry, including aspects of interaction between power harvesting circuitry and an exemplary tire electronics system is disclosed in commonly owned patent application with U.S. Ser. No. 10/143,535, entitled "SYSTEM AND METHOD FOR GENERATING ELECTRIC POWER FROM A ROTATING TIRE'S MECHANICAL ENERGY USING PIEZOELECTRIC FIBER COMPOSITES," which is incorporated herein by reference for all purposes.

When a sufficient amount of electric charge is generated in the piezoelectric patch 20 and subsequently stored in energy storage device 32, it may then be used to power a tire electronics assembly 36, which may include any number of components or combinations thereof. Tire electronics assembly 36 may include such exemplary components as a revolution counter, a condition-responsive device, a rechargeable battery, a flashing light assembly, a microcontroller, a global positioning system (GPS) and/or a radio frequency (RF) device. The above-referenced U.S. patent application with U.S. Ser. No. 10/143,535, entitled "SYSTEM AND METHOD FOR GENERATING ELECTRIC POWER FROM A ROTATING TIRE'S MECHANICAL ENERGY USING PIEZOELECTRIC FIBER COMPOSITES," includes additional examples of a tire electronics system that may be powered with a piezoelectric assembly. It is within the spirit and scope of the present invention that the subject improved piezoelectric structures as disclosed herein may be employed with the technology disclosed in U.S. Ser. No. 10/143,535 or with any combination of elements therein.

It should be appreciated in accordance with the disclosed technology that other electronic devices other than those specifically disclosed in the present specification, or those incorporated herein by reference, may be utilized with the subject piezoelectric power generation technology. The number of electronics applications capable of being powered in accordance with aspects of the disclosed technology are vastly numerous and should in no way be limiting to the present subject matter.

As previously mentioned, circuitry associated with the subject piezoelectric structures may also be provided to monitor the piezoelectric structures and determine when repoling is needed as well as to actually repole the piezoelectric structures. One example of monitoring the performance of the piezoelectric structures in modular patch 20 is to monitor the amount of charge stored at energy storage device 32 or at another dedicated energy storage element (e.g., a capacitor) provided in conjunction with the modular patch 20 (such as could be provided in electronics assembly 36). Capacitance levels associated with such an energy storage device may be directly correlated to properties of the piezoelectric material in modular patch 20, such as the dielectric constant of such materials. The capacitance levels measured at an associated energy storage device may be compared to predetermined capacitance levels programmed at a microcontroller provided in the electronics assembly 36. If the measured values fall below the predetermined threshold values, device repoling may then desirably be effected. Since a relatively large voltage may need to be employed in device repoling, a voltage converter may also be supplied to convert stored energy from relatively lower voltages to a higher voltage (such as on the order of about 300V or other specific level as determined by the type and thickness of the piezoelectric material in modular patch 20). Such relatively higher voltage may then be applied across the electrodes of the piezoelectric material in modular patch 20 to effect device repoling.

Additional design constraints of a piezoelectric patch 20, for use as a power generation device in accordance with the present subject matter may be considered for certain applications. For instance, additional reinforcement may be afforded to a piezoelectric patch 20 by providing it adjacent to a support substrate 38 as illustrated in FIG. 6. Modular patch 20 may be adhered to support substrate 38 in accordance with any of the known methods. In other exemplary embodiments, modular patch 20 may alternatively be embedded in the support substrate. The combination of piezoelectric patch 20 with support substrate 38 facilitates the mechanical distribution of strain forces seen by the piezoelectric fiber material within patch 20. By improving the equalization of strain across patch 20, all piezoelectric structures generally work at the same tension. Reinforced piezoelectric patches are able to survive for a much longer duration of time within a tire structure and corresponding vehicular environment.

Since support substrate 38 preferably serves to distribute strain as uniformly as possible across piezoelectric patch 20, support substrate 38 is also preferably characterized by uniform thickness and levels of stiffness. The actual thickness of the support substrate may be designed in accordance with the type of material used in the tire structure with which a piezoelectric patch in accordance with the present subject matter is integrated. An optimum combination of substrate thickness and modulus of elasticity for the tire structure may be designed to ensure both proper actuation of the piezoelectric patch and ability to integrate the patch with the tire structure in an appropriate manner. In some embodiments of the technology, the stiffness level is uniform but also easily adjustable. Exemplary support substrate 38 may also be characterized in some embodiments by properties such as low hysteresis, chemical inertness, and an inherent ability to survive in a tire environment. A particular example of a material suitable for forming support substrate 38 is a printed circuit board (PCB) material such as fiberglass or other such material. Another example of a suitable material for forming support substrate 38 is a high modulus rubber compound.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

The invention claimed is:

1. A power generation device, comprising:
   a modular patch of piezoelectric material configured to generate an electric charge therein upon said power generation device being subjected to mechanical vibrations, said modular patch comprising:
a plurality of elongated piezoelectric structures;
a plurality of metallic cores, each metallic core substantially surrounded by one of said plurality of elongated piezoelectric structures, wherein the collective plurality of metallic cores is configured to function as a first electrode for the modular patch of piezoelectric material; and
conductive material encompassing each of said plurality of elongated piezoelectric structures and forming a common second electrode for the modular patch of piezoelectric material; and
an energy storage device configured to receive said electric charge from said modular patch of piezoelectric material and to store selected amounts of said electric charge therein.

2. The power generation device of claim 1, wherein said plurality of piezoelectric structures comprise barium titanate fibers.

3. The power generation device of claim 1, wherein said piezoelectric structures comprise a material selected from the group consisting of quartz, barium titanate, cadmium sulfide, lead zirconate titanate (PZT), polyvinylidene fluoride (PVDF), and polyvinyl chloride (PVC).

4. The power generation device of claim 1, further comprising means for monitoring the amount of electric charge generated by said modular patch of piezoelectric material to determine preselected characteristics of a pneumatic tire structure.

5. The power generation device of claim 4, wherein said predetermined characteristics are selected from the group consisting of temperature, pressure, number of tire revolutions, vehicle speed, and level of static and dynamic forces acting on a tire structure.

6. The power generation device of claim 1, wherein said modular patch of piezoelectric material is integrated with a selected portion of a pneumatic tire structure and is configured to generate an electric charge therein upon said pneumatic tire structure being subjected to mechanical strains.

7. The power generation device of claim 1, further comprising means for monitoring the electric charge generated by said modular patch of piezoelectric material to determine when poling effectiveness of the piezoelectric structuresfalls below a predetermined threshold level.

8. The power generation device of claim 7, further comprising a power source coupled to respective first and second electrodes of said modular patch for repoling the modular patch of piezoelectric material when device effectiveness falls below said predetermined threshold level.

9. The power generation device of claim 1, further comprising at least one electronic component selected from the group consisting of a revolution counter, a condition-responsive device, a rechargeable battery, a flashing light assembly, a microcontroller, a global positioning system (GPS), and a radio frequency (RF) device, and wherein said at least one electronic component is powered by the electric charge generated in said modular patch of piezoelectric material.

10. The power generation device of claim 1, wherein said energy storage device comprises one of an electrolytic capacitor, a super capacitor, a rechargeable solid-state battery, and a rechargeable chemical battery.

11. An electronics assembly, comprising:
at least one piezoelectric wire structure, said at least one piezoelectric wire structure comprising:
an elongated portion of piezoelectric material;
a metallic core substantially surrounded by said elongated portion of piezoelectric material, said metallic core configured to function as a first electrode for the piezoelectric structure; and
a conductive outer sheath covering selected areas of said elongated portion of piezoelectric material, said conductive outer sheath configured to function as a second electrode for the piezoelectric structure; and
a microcontroller coupled to said at least one piezoelectric wire structure for monitoring amounts of electric charge generated by or provided to said at least one piezoelectric wire structure.

12. The electronics assembly of claim 11, wherein said piezoelectric material comprises barium titanate fibers.

13. The electronic assembly of claim 11, wherein said piezoelectric material comprises a material selected from the group consisting of quartz, barium titanate, cadmium sulfide, lead zirconate titanate (PZT), polyvinylidene fluoride (PVDF), and polyvinyl chloride (PVC).

14. The electronics assembly of claim 11, wherein said at least one piezoelectric wire structure is adapted to operate as a condition-responsive device to monitor predetermined characteristics of a given environment by generating varied amounts of electric charge relative to the predetermined characteristics.

15. The electronics assembly of claim 14, wherein said predetermined characteristics are selected from the group consisting of temperature, pressure, and level of static and dynamic forces acting on said given environment.

16. The electronics assembly of claim 11, wherein said at least one piezoelectric wire structure is integrated with a selected portion of a pneumatic tire structure and is configured to sense at least one predetermined characteristic selected from the group consisting of temperature, pressure, number of tire revolutions, vehicle speed, and level of static and dynamic forces acting on said pneumatic tire structure.

17. The electronics assembly of claim 11, further comprising means for controlling said piezoelectric structure as a mechanical actuator device.

18. The electronics assembly of claim 11, wherein said at least one piezoelectric wire structure is oriented in a two-dimensional sinusoidal configuration.

19. The electronics assembly of claim 11, wherein said at least one piezoelectric wire structure is oriented in a three-dimensional helical configuration.

20. The electronics assembly of claim 11, wherein said metallic core substantially surrounded by said elongated portion of piezoelectric material is formed by co-extrusion.

21. The electronics assembly of claim 11, wherein said elongated portion of piezoelectric material is formed around said metallic core by one of dipping, spraying, or employing plasma deposition.

22. The electronics assembly of claim 11, further comprising a radio frequency (RF) device coupled to and controlled by said microcontroller for communicating signals output by or for input to said at least one piezoelectric wire structure.

23. A tire assembly with integrated power generation features, said tire assembly comprising:
a pneumatic tire structure characterized by a crown having a tread portion for making contact with a ground surface, bead portions for seating said tire to a wheel rim, and sidewall portions extending between each bead portion and the crown; and
a modular patch of piezoelectric material integrated with a select portion of said pneumatic tire structure, said modular patch configured to generate an electric charge therein upon said pneumatic tire structure being subjected to mechanical strains, said modular patch including:
- a plurality of elongated piezoelectric structures,
- a plurality of metallic cores, each metallic substantially surrounded by one of said plurality of elongated piezoelectric structures, wherein the collective plurality of metallic cores is configured to function as a first electrode for the modular patch of piezoelectric material, and
- conductive material encompassing each of said plurality of elongated piezoelectric structures and forming a common second electrode for the modular patch of piezoelectric wire structures.

24. The tire assembly of claim 23, wherein the piezoelectric structures in said modular patch comprise a material selected from the group consisting of quartz, barium titanate, cadmium sulfide, lead zirconate titanate (PZT), polyvinylidene fluoride (PVDF), and polyvinyl chloride (PVC).

25. The tire assembly of claim 23, further comprising means for monitoring the amount of electric charge generated in said modular patch to determine predefined characteristics of a pneumatic tire structure.

26. The tire assembly of claim 25, wherein said predetermined characteristics are selected from the group consisting of temperature, pressure, number of tire revolutions, vehicle speed, and level of static and dynamic forces acting on a tire structure.

27. The tire assembly of claim 23, further comprising an energy storage device configured to receive the electric charge generated in said modular patch of piezoelectric material and to store selected amounts of electric charge therein.

28. The tire assembly of claim 27, wherein said energy storage device comprises a device selected from the group consisting of an electrolytic capacitor, a non-electrolytic capacitor, a super capacitor, a rechargeable solid-state battery, and a rechargeable chemical battery.

29. The tire assembly of claim 23, further comprising means for monitoring the electric charge generated by said modular patch of piezoelectric material to determine when the poling effectiveness of the piezoelectric structures falls below a predetermined threshold level.

30. The tire assembly of claim 29, further comprising a power source coupled to respective first and second electrodes of said modular patch for repoling the modular patch of piezoelectric material when device effectiveness falls below said predetermined threshold level.

31. The tire assembly of claim 23, further comprising at least one electronic component selected from the group consisting of a revolution counter, a condition-responsive device, a rechargeable battery, a flashing light assembly, a microcontroller, a global positioning system (GPS) and a radio frequency (RF) device, and wherein said at least one electronic component is powered by the electric charge generated in said modular patch of piezoelectric material.

32. The tire assembly of claim 23, further comprising a support substrate, wherein said modular patch is embedded in said support substrate.

33. A method for generating power from piezoelectric materials integrated with a vibrational system, said method comprising the following steps:
- providing at least one piezoelectric wire structure at a selected location relative to the vibrational system, wherein said at least one piezoelectric wire structure is characterized by an elongated portion of piezoelectric material configured with an inner electrode and an outer electrode;
- subjecting said at least one piezoelectric wire structure to mechanical strains associated with the vibrational system such that electric charge is generated within said at least one piezoelectric wire structure; and
- storing selected amounts of the electric charge generated in said at least one piezoelectric wire structure such that said stored electric charge is available for powering electronic devices associated with said vibrational system.

34. The method of claim 33, further comprising the step of conditioning the flow of electric charge generated in said at least one piezoelectric wire structure before said storing step.

35. The method of claim 33, further comprising the step of providing a regulated voltage source from the stored electric charge to a microcontroller additionally coupled to said vibrational system.

36. The method of claim 33, wherein said vibrational system comprises a tire or wheel assembly and wherein the mechanical strains of said subjecting step associated with the vibrational system correspond to mechanical strains generally occurring as the tire or wheel assembly rotates along a ground surface.

* * * * *